United States Patent [19]
Cartledge et al.

[11] Patent Number: 4,970,443
[45] Date of Patent: Nov. 13, 1990

[54] CATHODE-RAY DISPLAY

[75] Inventors: Malcolm Cartledge, Abbotsbrook; Trevor V. Montgomery, Bushey, both of England

[73] Assignee: Kontron Instruments Holdings NV, Curacao, Netherlands Antilles

[21] Appl. No.: 312,159

[22] Filed: Feb. 21, 1989

[30] Foreign Application Priority Data

Mar. 1, 1988 [GB] United Kingdom ............... 8804798

[51] Int. Cl.$^5$ ............................................. H01J 29/52
[52] U.S. Cl. ..................................... 315/383; 315/379
[58] Field of Search ............... 315/386, 379, 367, 383, 315/380, 384, 385

[56] References Cited

U.S. PATENT DOCUMENTS 3,186,403  6/1965  Bassett ............................. 315/383

OTHER PUBLICATIONS

Kats et al., Medical Oscilloscope with Digital Storage, Biomed. Eng. (U.S.A.) vol. 13 #4 (Jul.-Aug. 1979).

Primary Examiner—Gregory C. Issing
Attorney, Agent, or Firm—Morgan & Finnegan

[57] ABSTRACT

A cathode-ray display for displaying a trace has a memory to store portions of digitized input signal. An analogue signal is created from the memory and is added to a ramp signal corresponding to the ramp signal utilized to control the field scanning of the cathode-ray display. A further high frequency signal is added to the superimposed analogue signal and ramp signal. The resultant combined signal is supplied to voltage discrimination means which control a switch which, in turn, controls the electron gun of the cathode-ray display.

18 Claims, 6 Drawing Sheets

CATHODE-RAY DISPLAY

BACKGROUND OF THE INVENTION

1. Field of the Invention

The present invention relates to a display and more particularly relates to a chathode-ray display, particularly applicable for medical diagnostics.

2. Description

It has been proposed previously to provide a cathode-ray display which is intended for use in displaying a single or multi-waveform or "trace". Such displays are frequently used in hospitals to provide, for example, a trace showing electrical activity in the brain, or showing electrical activity in the heart muscles.

Many such arrangements have been proposed previously in which an analogue signal, or voltage, is applied to one pair of deflecting plates in a cathode-ray display tube, and a timing ramp signal is applied to a transverse pair of plates. An appropriate "trace" is thus written on the display screen of the cathode-ray tube.

In other arrangements a conventional cathode-ray tube arrangement having a scanning raster, such as is used in a conventional television, is utilised. However, problems can arise in such an arrangement where the trace is extending in the same direction as the lines of the raster.

SUMMARY OF THE INVENTION

The present invention seeks to provide an improved display arrangement.

According to this invention there is provided a cathode-ray display for displaying a trace of an analogue input signal, said display comprising a cathode-ray display device wherein an electron beam from a gun is scanned over a predetermined raster pattern, the raster comprising a plurality of substantially parallel lines, means to digitise the analogue input signal, a memory adapted to store portions of the digitised signal, and means to re-create an analogue signal, the analogue signal being added to a ramp signal corresponding to the ramp signal utilised to control the field scanning of the cathode-ray display, and a further high frequency signal being added to the superimposed analogue signal and ramp signal, the resultant combined signal being subjected to voltage discrimination to control a switch which, in turn, controls the electron gun of the said cathode-ray display.

Preferably the frequency of said high frequency signal is such that at least one cycle of the signal is completed in the time that it takes the beam of the cathode-ray tube to pass a single point on the display screen in the direction of a raster line.

Conveniently the frequency is such that at least 2.5 cycles are completed during the time that it takes the beam of the cathode-ray tube to pass a point on the display screen in the raster line direction.

Advantageously a gradient discriminator is provided to discriminate the gradient of the input signal, the gradient discriminator controlling a switching arrangement adapted to switch the said high frequency to an adding circuit which adds the high frequency to the combined ramp signal and analogue signal, the arrangement being such that the high frequency is only supplied to the adding circuit when the gradient is within predetermined limits.

Preferably said switching arrangement includes a high Q filter.

Conveniently said discrimination is effected by two voltage discriminators set to discriminate at two different voltages.

Advantageously at least one said discriminator is adjustable.

Preferably both said discriminators are adjustable.

Conveniently the cathode-ray tube is adapted to effect scanning on a standard two-in-one interlaced mode.

Preferably means are provided for adding an off-set voltage to the frame ramp signal which is combined with said analogue signal on each alternate cycle thereof.

Advantageously the said cathode-ray display is a conventional display operating on the 625 line scanning mode. However, it is to be understood that any convenient line scanning raster may be used, such as a 405 or 525 live system.

Preferably said high frequency is at least 7.5 MegHz.

Conveniently said high frequency is of the order of 20.5 MegHz.

Advantageously the input signal is digitised in an analogue to digital converter and is then stored in a random access memory of the shift register type so that the information in the memory may be up-dated from time-to-time, there being a digital to analogue converter adapted to read the information in the random access memory and converted into an analogue signal repeatedly, many repeats of the analogue signal being added to each cycle of the ramp signal.

Preferably the number of repeats of the analogue signal added to the ramp signal is equal to the number of lines of raster provided during that ramp signal.

BRIEF DESCRIPTION OF THE DRAWINGS

In order that the invention may be more readily understood, and so that further features thereof may be appreciated, the invention will now be described, by way of example, with reference to the accompanying drawings in which.

DETAILED DESCRIPTION OF THE PREFERRED EMBODIMENTS

Figure 1:
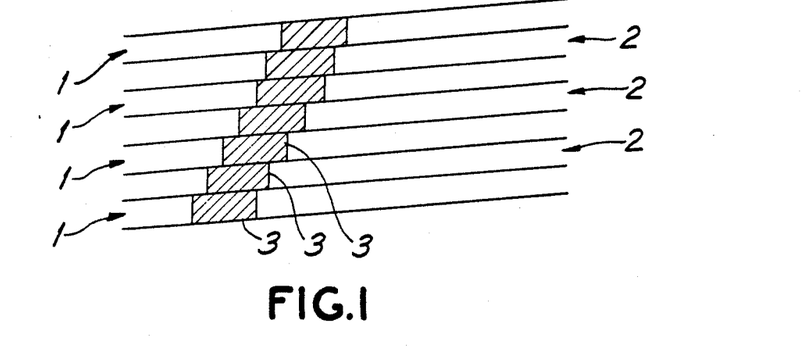
FIG. 1 is a view illustrating part of the display screen of a conventional cathode-ray tube operating with a conventional scanning raster, indicating part of a trace on the display.

Referring now to the drawings, FIG. 1 illustrates part of the display screen of a conventional cathode-ray tube display, which is adapted to operate in the so-called 625 line scanning mode. This is the scanning mode used on all present conventional PAL system I television sets and on many conventional monitors.

As is well known, when a cathode-ray tube operates in this mode an electron beam from an electron gun is deflected by deflecting coils so as to traverse a plurality of scanning lines. During a first field, which lasts for one-fiftieth of a second, the electron beam is caused to scan 312½ lines on the front face of the screen, the lines being slightly inclined. Examples of such lines are indicated by the reference numeral 1 in FIG. 1. Subsequently a further field of 312½ lines is traversed by the electron beam, these lines being interlaced with the lines 1. The two fields make up a single frame, and there are 25 frames per second. The lines 2 of the second field are alternated with the lines 1, and are inclined in a similar direction.

If a trace of a single line is to be displayed on the screen the electron beam is activated or switched-on for the moments of time when the beam is directed towards the part of the display screen where the line or trace is to be written. As can be seen in FIG. 1, the electron beam is shown to have been activated to illuminate various areas 3 of the lines 1 and 2, and the illuminated areas taken together form part of a steeply rising trace.

Figure 2:
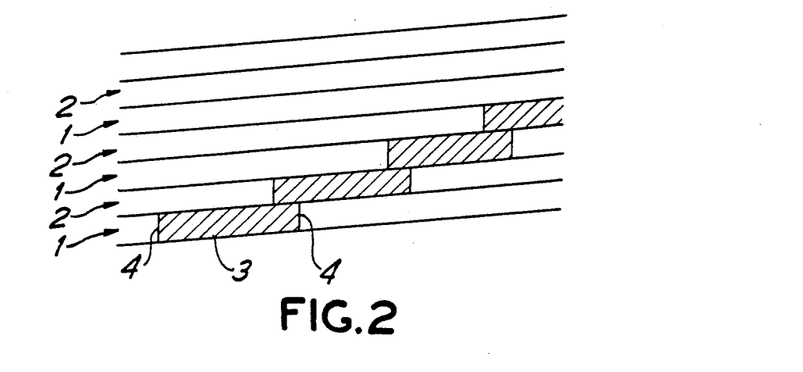
FIG. 2 is a view corresponding to FIG. 1 showing another part of the trace.

The trace illustrated in FIG. 1 may be found to be satisfactory, because the trace is substantially steeply rising. Reference is now made to FIG. 2, which corresponds to FIG. 1 but shows a trace which is more inclined towards the horizontal. It can be seen that the trace shown in FIG. 2 is much less satisfactory, in view of the sharp transitions 4 between regions of the lines where the electron beam is activated and is not activated. It is possible that, in the condition illustrated in FIG. 2, a certain amount of interlace "flicker" will be observed by a person looking at the display. Also, relatively small variations in the input signal to the apparatus may cause the display trace "jump" from one scanning line to the next.

Figure 3:
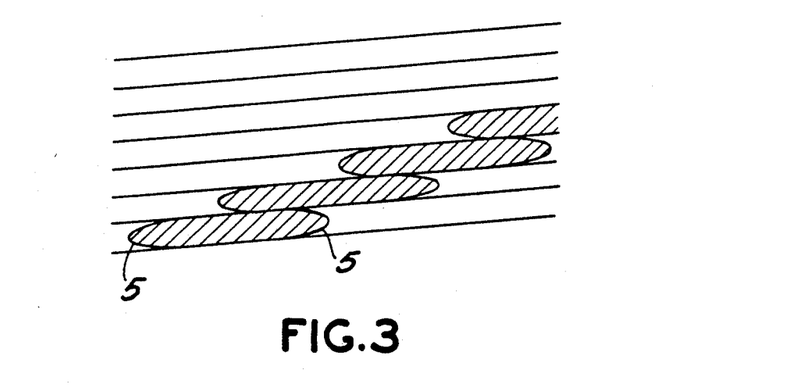
FIG. 3 is a view corresponding to FIG. 2 showing the same part of the trace when modified in a digital manner, or with an apparatus in accordance with the invention.

It is to be appreciated that in order to write a trace of the type described on the cathode-ray display having the described standard scanning raster it is necessary to take the initial analogue signal coming, for example, from a patient whose heart is being monitored, and to digitise that signal, and then process the digitised signal to produce an appropriate input to the cathode-ray display that is operating with the described scanning raster. It has been proposed previously to modify the signal supplied to the cathode-ray display in such a way that, when the trace to be written is substantially parallel with the direction of the scanning lines, the electron beam is activated and deactivated gradually and is not switched on and off suddenly. This is shown at 5 in FIG. 3. Thus the illuminated part of each line ends, at each end, with a "grey" region. This provides a much more acceptable display. However, complex and expensive digital switching equipment must be utilised in order to provide this effect, since in order to provide the "grey" region of a correct size it is necessary to determine what is to be displayed on the adjacent lines of the display. The present invention essentially provides an arrangement for providing this effect without the expense of the digital equipment that has been proposed previously.

Figure 4:
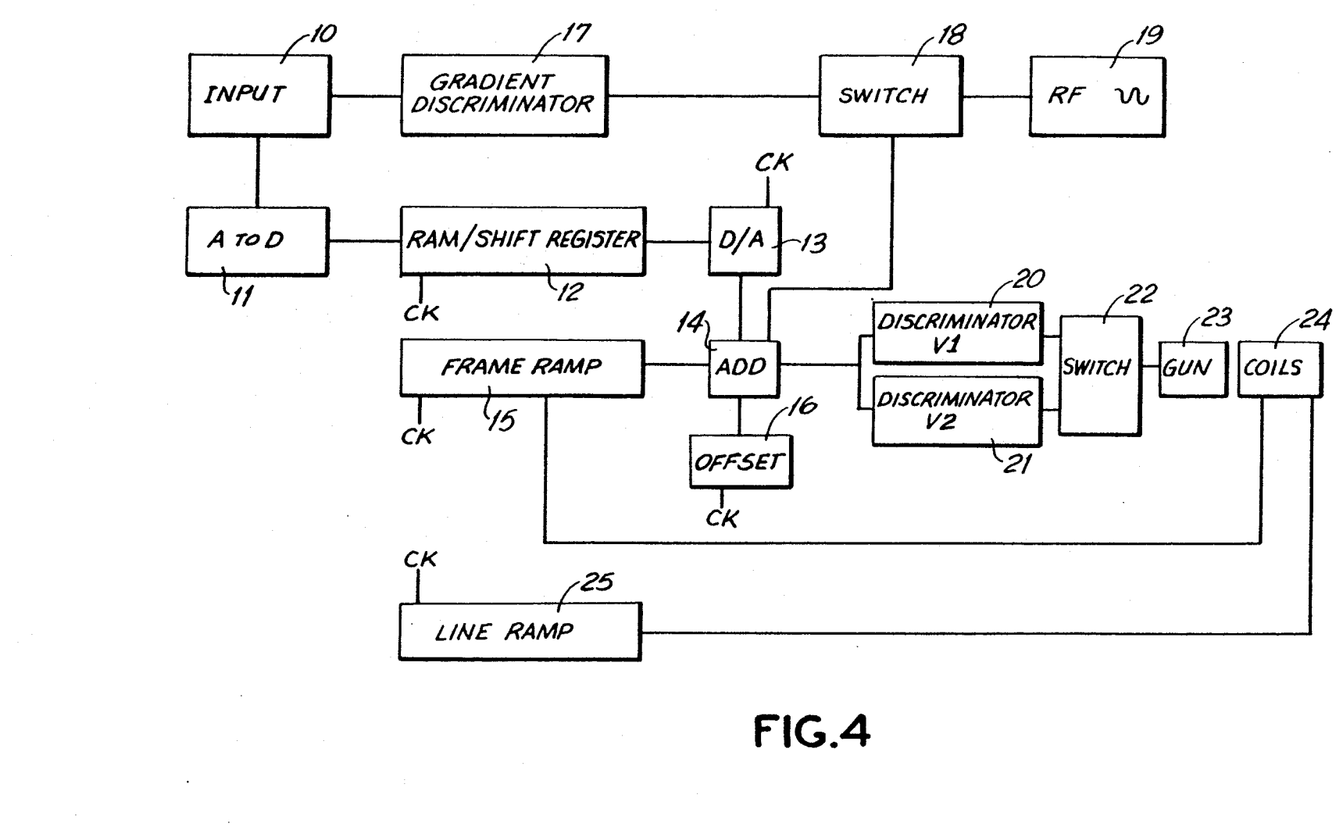
FIG. 4 is a block diagram of an apparatus in accordance with the invention.

Reference may now be made to FIG. 4 of the accompanying drawings which is a block diagram of an arrangement in accordance with the invention. Signals from an input 10, which may, for example, be an amplifier associated with electrodes positioned to sense electrical signals present in the region of the heart of a patient, are supplied to an analogue to digital converter 11 where successive samples of the analogue signal are digitised with ten-bit accuracy. These signals are fed to a random access memory (RAM) 12 which is also in the form of a shift register. The random access memory can contain information relating to 1,024 samples of the original input analogue waveform, thus representing six seconds of the initial waveform. Every time a new frame of the scanning raster in cathode-ray display is initiated new information is accepted into the RAM 12 from the analogue to digital converter 11, and all the information in the RAM is moved, the oldest information being discarded.

The RAM 12 is accessed by a digital to analogue converter 13 which continually and repeatedly converts the digital information stored in the RAM into an analogue signal having a duration of 64 micro-seconds. This analogue signal repeats continually. The output of the digital to analogue converter is supplied to an adding circuit 14.

Also supplied to the adding circuit 14 is the output of a frame ramp generator 15 which is of a conventional design. Also supplied to the adding circuit 14 at predetermined times is an off-set voltage signal from an off-set voltage signal generator 16.

A signal from the input 10 is also fed to a gradient discriminator 17 adapted to discriminate the gradient of the input signal, or, in other words, the gradient of a trace to be displayed in response to the input signal. The gradient discriminator is described hereinafter with reference to FIG. 5. The output of the gradient discriminator 17 controls a switch 18 which serves, when closed, to connect the output of a radio frequency signal generator 19 to the adding circuit 14. The switch effectively incorporates a high Q filter so that when the radio frequency 19 is supplied to the adding circuit 14, the amplitude of the signal supplied increases gradually over a few cycles of the radio frequency signal.

The output of the adding circuit is fed to two voltage discriminators 20, 21. Each discriminator is adapted to discriminate signals of a particular voltage, as will be described hereinafter, and each discriminator may be adjustable.

The discriminators 20, 21 are adapted to control a switch 22 which actuates an electron gun 23 forming part of a cathode-ray display tube of conventional design, adapted to operate on the 625 line scanning raster. The electron beam emitted by the gun 23 passes through coils 24, some of which are controlled by signals from the frame ramp generator 15 (or from another ramp generator operated in synchronism with the frame ramp generator 15) and others of which are controlled by signals from a line ramp generator 25.

As will become apparent from the following explanation it is important that various items of the arrangement described above work in a synchronised way, and thus synchronising clock pulses or other equivalent controlling signals CK are supplied to the RAM 12 and the ramp generators, and other components.

Figure 5:
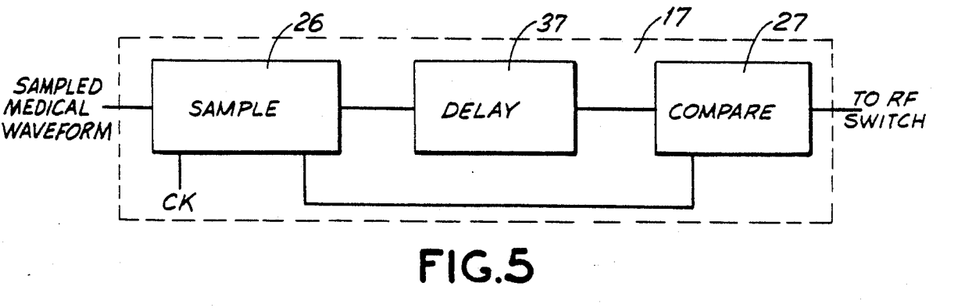
FIG. 5 is a block diagram of part of the arrangement shown in FIG. 4 related to a gradient discriminator.

Referring now to FIG. 5 the gradient discriminator 17 consists of a sampling circuit 26 which regularly samples the signal provided at the input 10. Successive samples are supplied directly to one input of a comparator 27 and, via a delay line 37, to the other input of the comparator. The sampling rate is such that the signal of a sample, when delayed by the delay line 37, can be compared directly with the successive or even the next-successive signal to be sampled. The comparator 27 is adapted to compare the two samples and to provide an output when the two samples are substantially equal or have such a relationship that the trace representative of the input signal will extend substantially parallel with the lines of the raster on the display screen.

Figure 6:
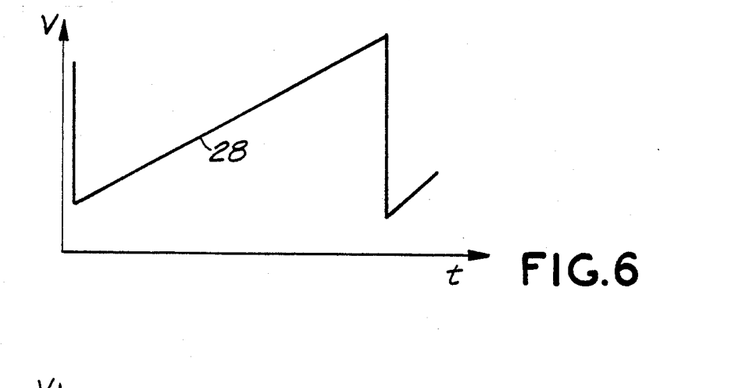
FIG. 6 shows the output of a ramp generator.
Figure 7:
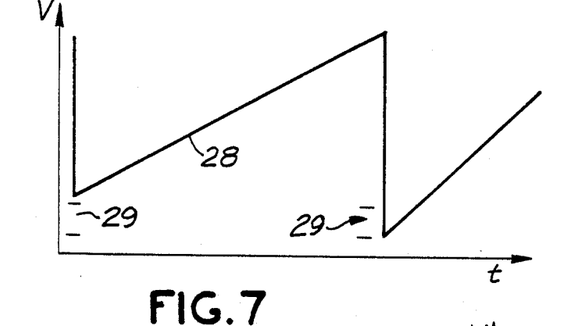
FIG. 7 shows the output of the ramp generator with an added offset.

FIG. 6 illustrates the output of the frame ramp generator 15. This is a conventional saw tooth waveform 28. FIG. 7, however, illustrates the conventional saw tooth waveform 28 wherein alternative sweeps of the waveform are provided with a DC off-set 29. This off-set 29 is added to the frame ramp signal 28 in the adding circuit 14. The purpose of this DC off-set on alternate signals will be explained hereinafter.

Figure 8:
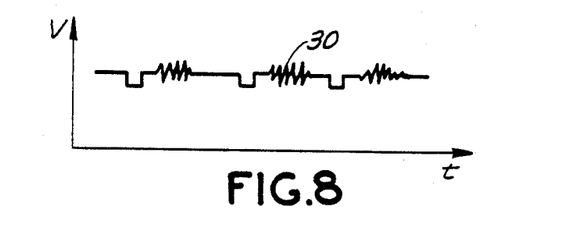
FIG. 8 is a very schematic illustration of the output of the shift register of FIG. 4 as applied to the adding circuit.

FIG. 8 illustrates, purely diagramatically, the nature of the analogue signal 30 supplied by the digital to analogue converter 13 to the adding circuit 14. As can be seen, this signal repeats, the signal having a duration of 64 micro-seconds.

Figure 9:
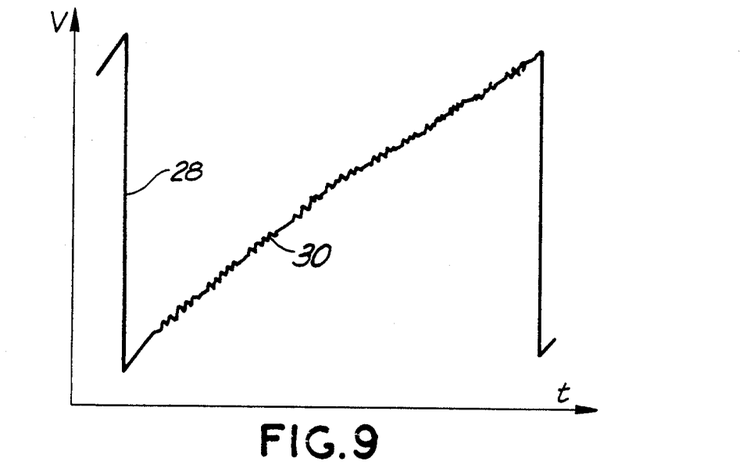
FIG. 9 is a very diagramatic view showing the combination of the ramp signal and the output from the shift register.

FIG. 9 illustrates, purely schematically, one cycle of the output of the adding circuit 14, when the signal from the digital to analogue converter has been added to the ramp signal from the frame ramp generator 15. It can be seen that the waveform generally resembles the saw tooth waveform 28, but has superimposed thereon a large number of the 64 micro-second signals 30, as shown in FIG. 8. In actual fact, during one cycle of the ramp signal 28, 312½ repeats of the signal 30 are superimposed on the ramp.

Figure 10:
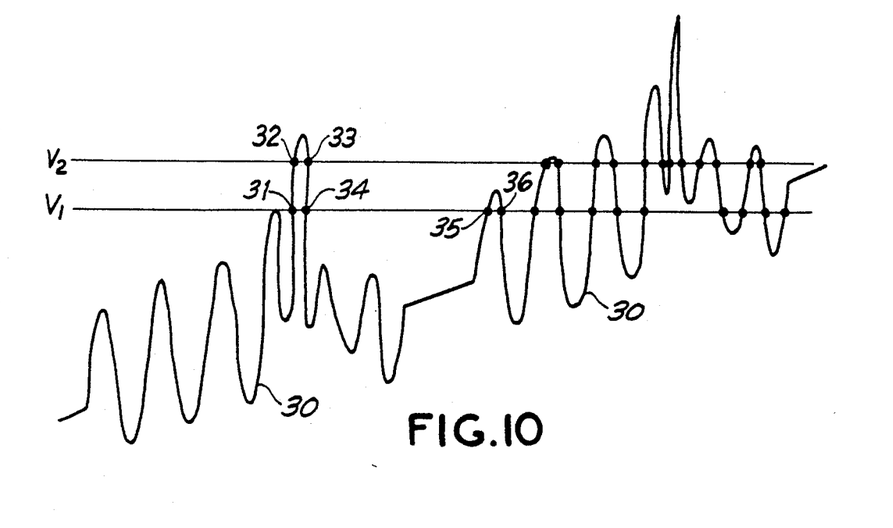
FIG. 10 is a very schematic enlargement of part of FIG. 8.

FIG. 10 is an enlarged part of the ramp as shown in FIG. 9, and overlaid on the ramp are two voltage values, V1, V2, which are the voltage values of the discriminators 20, 21.

As seen in FIG. 4, the discriminators 20, 21 are associated with a switch 22 and the arrangement is such that the switch 22 is activated whenever the value of the signal sensed by the discriminators is between the voltage VI and V2. Thus, for example, at point 31, when the waveform initially passes the voltage VI, the discriminator 20 will switch on the switch 22, whereas at point 32 the discriminator 21 will switch the switch off, since at that point the voltage exceeds the voltage V2. At point 33 the discriminator 21 again switches on the switch 22 and at point 34 the discriminator V1 switches off the switch 22. At point 35 the discriminator V1 switches on the switch 22 and at point 36 the discriminator V1 switches off the switch 22. The discriminators 20 and 21, and the associated switch, are capable of operating at very great speed, and the switch may be switched on or off for periods as short as 3 nano seconds.

It will be appreciated that whenever the switch 22 is turned on the electron gun 23 is activated. At that particular instant the electron beam from the gun is directed in a predetermined direction by the scanning coils 24 and the arrangement is such that the electron beam, when activated, creates the desired trace on the display screen.

Figure 11:
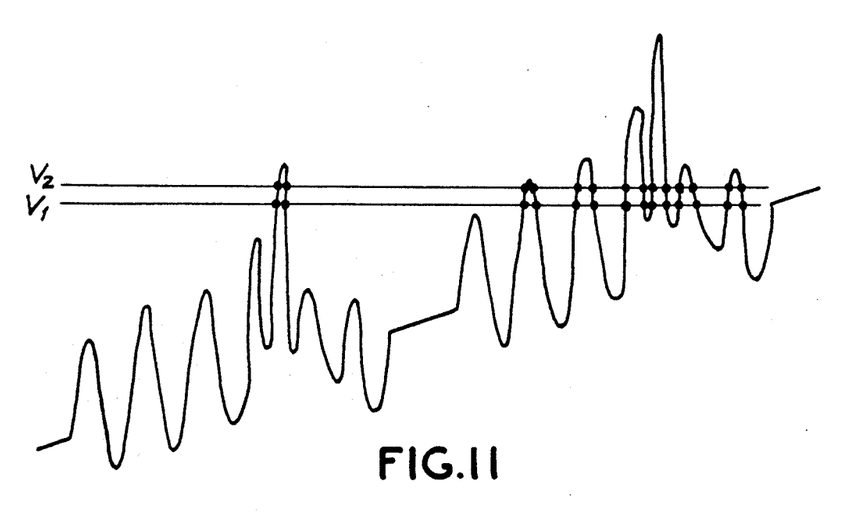
FIG. 11 is another view corresponding to FIG. 9.

It is to be appreciated that the voltages V1 and V2 may be adjusted. For example, as shown in FIG. 11, the voltage difference between the voltages V1 and V2 may be relatively narrow when compared with the difference between the voltages as illustrated by way of example in FIG. 10. Alternatively, of course, the voltage of V1 may have a very low level and it is to be appreciated that the difference between the voltages V1 and V2 will influence the actual thickness of the trace as displayed on the screen. If the voltage V1 is reduced significantly, the trace may take a form such that the entire bottom part of the screen is illuminated, and the top part of the screen is not illuminated, the boundary between the illuminated part and the unilluminated part defining the trace. If the voltages V1 and V2 are adjusted simultaneously it is possible to move the trace physically up or down the display screen. It is for this reason that the discriminators 20 and 21 are both preferably adjustable.

The described embodiment of the invention is provided with a switch 18, controlled by the gradient discriminator 17, to add, to the waveforms described above, an R.F. frequency or very high frequency. The precise frequency is not critical to the invention provided that the frequency is at least such that one cycle of the signal having that frequency will be completed during the time that it takes the beam from the cathode-ray gun to pass a single point on the display screen, or, in other terms, the "width" of the spot generated by the cathode-ray beam on the display screen when considered in terms of time in the scanning line direction. Typically the width of the spot is in the region of 75–150 nano seconds and thus a frequency of the order of at least 7.5 MegHz should be utilised. However, it is preferred that at least two and preferably three cycles of the frequency should be completed during the time taken for the cathode-ray beam to pass a single point, and thus preferably frequencies of up to or in excess of 20 MegHz are utilised. A typical preferred frequency is 20.5 MegHz.

Figure 12:
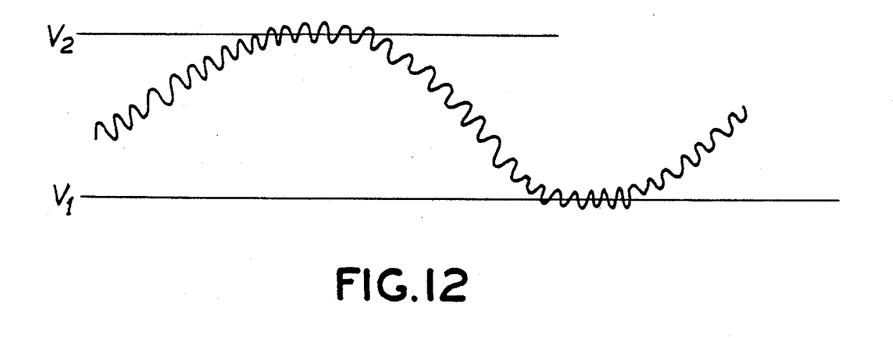
FIG. 12 is an enlarged view of part of FIG. 9 or 10 showing the waveform with a further added radio-frequency signal.

As can be seen from FIG. 12, the superimposed frequencies impart a noticeable ripple to the signal as put to the discriminators 20, 21. It can be seen, from FIG. 12 that as the overall signal level reaches the level of the voltage V2 the discriminator 21 switches on and off rapidly, following the fluctuations of the ripple. The result of this is that the electron gun is not fully activated or suddenly switched-on, but instead is activated in a series of relatively short bursts. Thus, when the waveform only gradually approaches the threshold voltage V1 or V2, instead of the discriminator having to make a sudden decision as to when the voltage has passed the threshold, the discriminator makes lots of decisions as the ripple passes and re-passes the threshold voltage. Each discriminator can preferably operate at a rate of above 100 MegHz, and thus it is possible to activate the electron gun for periods as brief as three nano seconds, or to terminate action of the gun for periods as brief as 3 nano seconds. The effect of this is that the electron gun is activated for periods having an appropriate length, thus effectively providing a "grey"

area at the end of each activation of the gun, the size of the "grey" area depending, effectively, upon the angle of inclination of the trace. It is also to be appreciated that when a trace is extending substantially along the axis of one line of the scanning raster, using the effect of the high frequency ripple, the next-adjacent line will be at least partly illuminated, this is because the electron gun will be activated as the beam scans this next-adjacent line. The degree of activation of the gun depends on the preparation of the waveform that exceeds the threshold voltage as this next-adjacent line is scanned. The electron gun is effectively switched on and off repeatedly with a signal which has a "mark to space" ratio determined by the preparation of the waveform that exceeds the threshold voltage.

It has been found that with the superimposed high frequency signal, as described, a very high degree of resolution can be obtained, and if a trace is gradually rising, that trace can rise gradually up a screen which is made up of a number of scanning lines, as described, with no apparent discontinuity and no apparent "jumping". Also if the voltages V1 and V2 are adjusted, again the trace on a display screen can move with no "jumping".

It is preferred to utilise a very high-speed frequency superimposed upon the signal supplied to the discriminators to avoid any problem of flicker or "beating". If a lower frequency than that suggested above is utilised, it has been found that it is almost unavoidable that "beating" occurs with either the frame scanning frequency or the line scanning frequency, or harmonies thereof and undesirable effects are obtained. However, by providing a frequency which is such that each cycle of the frequency occurs in less than the time taken for the cathode-ray beam to pass one single point, no such beating is visible.

Figure 13:
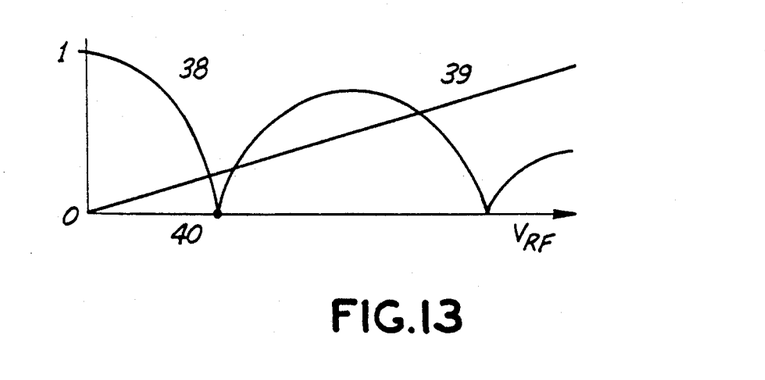
FIG. 13 is further diagrammatic graphical figure.

It has been found that the amplitude of the radio frequency can be adjusted to provide a situation where there is virtually no flicker. Thus, in setting up the described arrangement, the amplitude of the radio frequency will be adjusted until a desired operating characteristic is obtained. FIG. 13 shows a curve 38 illustrating the degree of strobing flicker (measured from a minimum of zero to a maximum of 1) against the amplitude $V_{RF}$ of the R.F. signal. It can be seen that as the amplitude of the R.F. signal rises from zero, the level of flicker falls to zero, but then rises back up to a maximum before again falling to zero. As the amplitude of the R.F. signal rises so the amplitude or width of the grey boundary at each edge of the trace increases as shown by line 39. Thus the arrangement is usually set with an R.F. amplitude equivalent to the first flicker null, shown as the R.F. calibration point 40.

Figure 14:
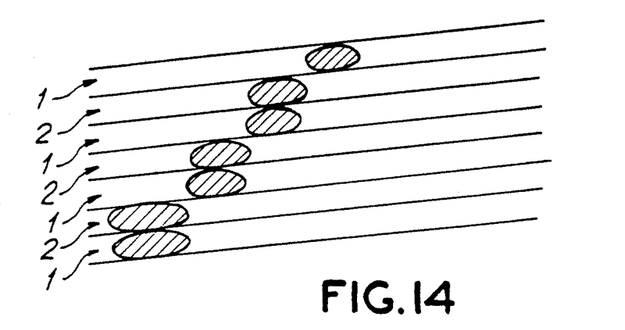
FIG. 14 is a view corresponding to FIGS. 1 to 3 showing part of a trace.
Figure 15:
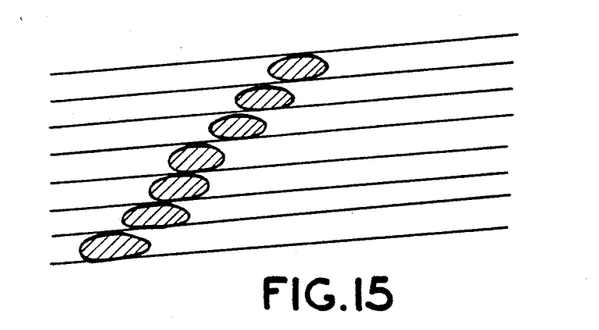
FIG. 15 is a view corresponding to FIG. 14 showing part of another trace.

It is to be remembered that reference was made to the fact that successive ramps are off-set with a predetermined voltage. It is to be understood that the ramp 28 repeats for two cycles whilst each frame is written on the display screen of the cathode-ray tube. During the first cycle a first set of lines 1 are written and during the second cycle a second set of lines 2 are written. It is to be appreciated that as the lines are written, the electron gun is activated by the signals from the discriminators. Of course, as will be understood, if the signal presented to the discriminators was precisely the same during each of the two fields making up a particular frame, then a situation as shown in FIG. 14 would arise in which the point of illumination in each adjacent pair of lines 1, 2 is the same. Thus two points of illumination are one above the other, regardless of the direction of the trace. It will immediately be appreciated that this is not desirable and does not represent the trace correctly. It has been discovered, however, that providing the ramp with an off-set, effectively the voltages of the discriminators 20 and 21 are adjusted, so that these discriminators operate at slightly different points on the signal presented to them. The result of this is that the display, instead of appearing as shown in FIG. 14, actually appears as shown in FIG. 15 which, it will be understood, is much more desirable.

The high frequency signal is really only required when the trace that is being displayed is substantially parallel to the axis of the lines of the raster. Indeed, the presence of the high frequency signal can cause problems when the trace is substantially orthogonal to the lines of the raster. It is for this purpose that the gradient discriminator 17 is provided to determine the gradient of the trace and to switch on and off the high frequency signal from the source 19 at appropriate times. The switch includes a high Q filter such that when the high frequency from the source 19 is switched on, the amplitude of that signal rises, over a few cycles, to a maximum. This provides a desired smoothing effect.

Figure 16:
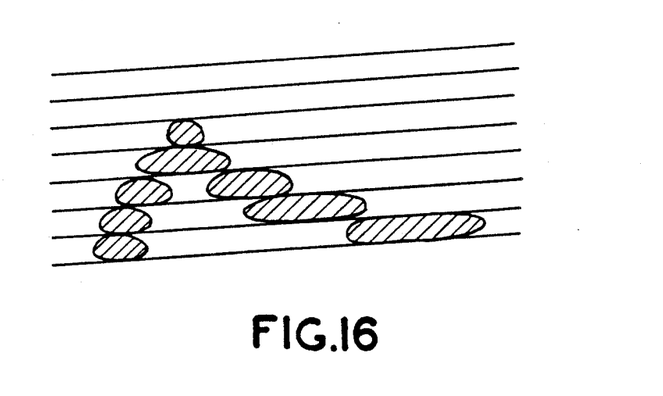
FIG. 16 is a view corresponding to FIGS. 14 and 15 showing part of another trace.

FIG. 16 shows part of a trace on a display of the invention. When the trace is nearly parallel with the raster lines the illuminated parts of the raster commence and end with "grey" areas, the size of which depends on the angle of the trace.

Whilst the invention has been described with reference to an embodiment in which the display operates with an inter-laced raster of a conventional format, it is to be appreciated that the invention may also be utilised with different raster patterns. Indeed, if appropriate raster patterns are selected it is possible that a very high quality display may be provided, giving greater visual definition. Thus, whilst an inter-lacing of two-to-one has been described, different inter-lacing, for example of four to one may be utilised or even a peseudo random inter-lace may be utilised.

We claim:

1. A cathode-ray display for displaying a trace of an analogue input, comprising:
a cathode-ray display device wherein an electron beam from a gun is scanned over a predetermined raster pattern, the raster comprising a plurality of substantially parallel lines; means to digitise the analogue input; a memory adapted to store portions of the digitised signal; means to create an analogue signal from the signal in the memory, the analogue signal being added to a ramp signal corresponding to the ramp signal utilised to control the field scanning of the cathode-ray display; and a further high frequency signal being added to the superimposed analogue signal and ramp signal for providing a ripple effect to the resultant combined signal being supplied to voltage discrimination means, said ripple effect is centered around the threshold of said discrimination means, said discriminator means capable of switching on and off the electron gun of the cathode-ray display according to the ripple effect of the combined signal.

2. A display according to claim 1 wherein at least one cycle of the high frequency signal is completed in the time that it takes the beam of the cathode-ray tube to traverse a distance equivalent to the beam diameter on the display screen, when scanned in the direction of a raster line.

3. A display according to claim 2 wherein at least 2.5 cycles of the high frequency signal are completed during the time that it take the beam of the cathode-ray tube to traverse a distance equivalent to the beam diameter on the display screen when scanned in the direction of a raster line.

4. A display according to claim 3 wherein a gradient discriminator is provided to discriminate a gradient of a medical input signal, the gradient discriminator controlling a switching arrangement adapted to switch the high frequency signal to an adding circuit which adds the high frequency signal to the combined ramp signal and analogue signal, the arrangement being such that the high frequency signal is only supplied to the adding circuit when the gradient is within predetermined limits.

5. A display according to claim 4 wherein said switching arrangement includes a high Q filter for causing an exponential rise and decay in amplitude of the high frequency signal.

6. A display according to claim 5 wherein said discrimination is effected by two voltage discriminators set to discriminate at two different voltages.

7. A display according to claim 6 wherein at least one said discriminator is adjustable.

8. A display according to claim 6 wherein both said discriminators are adjustable.

9. A display according to claim 8 wherein the cathode-ray tube is adapted to effect scanning on a standard two-in-one interlaced mode.

10. A display according to claim 9 wherein means are provided for adding an off-set voltage to the frame ramp signal which is combined with said analogue signal on each alternate cycle thereof to adjust the effective threshold voltage of the discriminators by a predetermined amount.

11. A display according to claim 10 wherein the cathode-ray display is a conventional display operating on the 625 line scanning mode.

12. A display according to claim 11 wherein said high frequency is at least 7.5 MegHz.

13. A display according to claim 12 wherein said high frequency is of the order of 20 MegHz.

14. A display according to claim 13 wherein the input signal is digitised in an analogue to digital converter and is then stored in a random access memory of the shift register type so that the information in the memory may be up-dated from time-to-time, there being a digital to analogue converter adapted to read the information in the random access memory and converted into an analogue signal repeatedly, many repeats of the analogue signal being added to each cycle of the ramp signal.

15. A display according to claim 14 wherein the number of repeats of the analogue signal added to the ramp signal is equal to the number of lines of raster provided during that ramp signal.

16. A display according to claim 6 wherein the two discriminators are capable of receiving different resultant combined signals.

17. A display according to claim 8 wherein the cathode-ray tube is adapted to effect scanning on a pseudo random interlaced mode.

18. A display according to claim 10 wherein the cathode-ray display includes a raster scan display.

* * * * *